United States Patent [19]
Dworsky

[11] Patent Number: 4,481,488
[45] Date of Patent: Nov. 6, 1984

[54] TRAPPED ENERGY RESONATOR FOR OSCILLATOR AND MULTIPLE RESONATOR APPLICATIONS

[75] Inventor: Lawrence N. Dworsky, Northbrook, Ill.

[73] Assignee: Motorola, Inc., Schaumburg, Ill.

[21] Appl. No.: 439,685

[22] Filed: Nov. 8, 1982

[51] Int. Cl.³ .................. H01L 41/04; H03B 5/32
[52] U.S. Cl. .................. 331/158; 310/320; 310/365; 310/366; 331/163; 333/189; 333/198
[58] Field of Search ............. 331/116 R, 158, 163; 310/320, 365, 366; 333/189–192, 198

[56] References Cited

U.S. PATENT DOCUMENTS

| | | | |
|---|---|---|---|
| 3,763,446 | 10/1973 | Toyoshima et al. | 333/72 |
| 4,048,593 | 9/1977 | Zillman | 333/70 R |
| 4,123,680 | 10/1978 | Kemper et al. | 310/320 |
| 4,156,214 | 5/1979 | Arvanitis et al. | 333/191 |
| 4,231,001 | 10/1980 | Hutchinson | 333/110 |
| 4,281,300 | 7/1981 | Arvanitis | 333/192 |
| 4,329,666 | 5/1982 | Arvanitis | 333/191 |
| 4,342,014 | 7/1982 | Arvanitis | 331/191 |
| 4,376,919 | 3/1983 | Konno et al. | 331/158 |

Primary Examiner—Siegfried H. Grimm
Attorney, Agent, or Firm—Jerry Miller; Edward M. Roney; James W. Gillman

[57] ABSTRACT

A trapped energy piezoelectric resonator for oscillator and multiple resonator applications has a piezoelectric substrate with electrodes disposed on each of its major surfaces. These electrodes are further comprised of a plurality of electrically interconnected and acoustically coupled sub-electrodes. The resonant frequency of these resonators may be controlled by varying the separation and, therefore, the acoustic coupling between the sub-electrodes. This resonator may be used in the feedback loop of an oscillator circuit as the frequency determining element. It may also be used to provide a resonator on a substrate carrying resonators of significantly different frequency.

9 Claims, 7 Drawing Figures

TRAPPED ENERGY RESONATOR FOR OSCILLATOR AND MULTIPLE RESONATOR APPLICATIONS

BACKGROUND OF THE INVENTION

1. Field of the Invention

This invention relates generally to the field of trapped energy resonators such as those used in piezoeletric crystals. A trapped energy resonator is a piezoelectric resonator which operates in the bulk coupled thickness shear and thickness twist modes. This invention more particularly addresses the problem of placing a number of independent resonators of potentially different resonant frequencies on the same piezoelectric substrate while maintaining acceptable series resistance and minimizing undesired spurious mode activity.

2. Background of the Invention

Several techniques for suppressing undesired spurious mode activity in trapped energy resonators are known in the prior art. By utilizing exotic electrode shapes similar to pie slices and placing barriers between resonators of multi-resonator designs, resonators have been made which improve various types of spurious responses with a limited degree of success. These resonator designs, however, can be implemented only with a sacrifice of other parameters such as series resistance or physical size. Due to the interrelationships of the electrical parameters, they cannot offer the additional degree of design freedom afforded by the present invention. Furthermore, they are often expensive to implement and do not even address the problem of placing a number of resonators of different frequencies on the same substrate. Frequently, the spurious activity they seek to suppress is only filter spurious response caused by undesired coupling between resonators rather than the spurious responses of the individual resonators which is one problem solved by the preferred embodiment of the present invention.

A typical prior art trapped energy resonator is shown in FIG. 1 as resonator 10. In this type of resonator a top metal electrode 15 and a bottom metal electrode 20 are placed on opposite surfaces of a substrate 25 by metal deposition or other process known in the art. The substrate 25 is composed of a piezoelectric material such as quartz which has been cut so that the electrodes will excite the thickness modes, as for example, the AT cut which is well known in the art. In FIG. 1, only one electrode pair is shown, however, the discussions to follow are equally applicable to multi-resonator designs.

A metallized runner 30 is attached to each of the rectangular electrodes 15 and 20 for the purposes of making connections to external circuitry such as an oscillator circuit. For rectangular electrodes such as those shown in FIG. 1, the sides of the electrode are usually disposed along the so-called "X" and "Z" axes of the crystalline structure of substrate 25 as is known in the art. In resonator 10, the series resistance ($R_s$) of the resonator at resonance is determined essentially by the area of the electrodes.

That is:

$$R_s \propto \frac{1}{L_x L_z} \quad (1)$$

where:

$L_x$ = the length of the electrode in the "X" direction.

$L_z$ = the length of the electrode in the "Z" direction.

The resonant frequencies of the resonator are characterized by complex equations which are well documented in the art and found in scientific journal articles such as those by H. F. Tiersten entitled "Analysis of Trapped Energy Resonators Operating in Overtones of Coupled Thickness Shear and Thickness Twist" which appeared in the *Journal of Acoustic Society of America*, Volume 59, No. 4, in April of 1976, and in a commonly authored paper entitled "An Analysis of Overtone Modes in Monolithic Crystal Filters" published in the *Proceedings of the 30th Annual Symposium on Frequency Control*, 1976, Page 103. These articles are hereby incorporated by reference. For the purposes of understanding this invention, however, the resonator's frequency (F) may be closely approximated by the following simple equation which is known in the art and can be derived from the above papers:

$$\text{where: } F \propto \sqrt{\frac{1}{H^2} + \frac{1}{L_x^2} + \frac{1}{L_z^2}} \quad (2)$$

$H$ = the sum of the substrate thickness plus the top electrode thickness plus the bottom electrode thickness.

In this equation the various physical constants have been set equal to 1 for convenience. Therefore, equation (2) will not accurately predict the frequency F but it does correctly show the interrelationship between H, $L_x$, and $L_z$ in determining F.

For substantially rectangular electrodes such as those shown in resonator 10, it is known that spurious mode responses for the series resistance of an individual resonator are optimally minimized when the peripheral geometry of the electrodes is approximately square for an aspect ratio of 1, that is $L_x = L_z$. This is also a known approximation which is readily derived from the discussion in the above-mentioned papers. The above approximation for frequency (F), equation (2), is correct within a few percent and is sufficiently close for the purposes of understanding the prior art and the present invention so that we may assume a square electrode geometry is the design goal.

It is known that the series resistance ($R_s$) of a resonator with rectangular electrodes at the spur frequency closest to resonance will typically follow one of the response curves as shown in FIG. 2. FIG. 2 represents the series resistance (or motional inductance) of a resonator as a function of the aspect ratio $L_x/L_z$ of the particular electrode design. Curve 35 shows an increase in $R_s$ with increasing aspect ratio and curve 40 shows a decreases $R_s$ with increasing aspect ratio. The important consideration however, is that both curves maximize near an aspect ratio of one. Therefore, the series resistance of the resonator, at its closest spurious frequencies, is maximum near an electrode aspect ratio of one.

Consider now the problem of placing several resonators of different frequencies on a single substrate using only techniques known in the prior art. This situation is encountered in, for example, a highly miniaturized superheterodyne receiver which, due to size constraints, requires a crystal filter and an oscillator resonator to be placed on the same quartz substrate. Practical fabrication and cost considerations dictate that H must be the same for all of the resonators on the common substrate. Practical circuit considerations normally result in a restriction on the maximum value of $R_s$ which means a minimum electrode area for each resonator. A third normal design constraint is that spurious responses, especially the closest spurs to resonance, be minimized. This implies that $L_x$ should approximately equal $L_z$.

In this situation, if the required resonant frequency is too high or the required series resistance is too low, the resonator designer has no choice but to degrade spurious responses in order to achieve an acceptable compromise of these goals. Therefore, in order to obtain the correct frequency, serious design compromises in series resistance and spurious responses are necessitated.

Some of the circuit problems which can result from high series resistance in crystal resonators are oscillators which fail to oscillate, or require large amounts of current to initiate and maintain oscillation or stop (or never start) oscillating at low temperatures. These problems are especially troublesome for battery powered portable equipment subject to operation over wide temperature ranges.

The problems which result from poor spurious mode response are best understood by observing FIG. 3 which shows an actual response curve 50 of a 150 MHz 5th overtone oscillator crystal designed according to the above-mentioned prior art design constraints and placed on the same substrate with a crystal filter. Curve 50 was generated by driving the resonator with a 50 ohm source and measuring the voltage output of the crystal loaded into a 50 ohm load. The desired response is at approximately 150 MHz measured at the operating overtone and the peak in response at $f_s$ is the closest spur (about 50 kHz away) to the desired response. For this electrode configuration approximately 700 angstroms of aluminum was disposited on each side of the substrate in a 13×68 mil rectangle. The shape factor of the available substrate real estate dictated that a square resonator was impossible. The series resistance at resonance is 150 ohms and at the spurious response it is 500 ohms. The relative loss at the spur frequency is only approximately 7 dB lower than the desired response at 150 MHz.

If this resonator were to be used in a oscillator design, it is quite likely the oscillator would oscillate at both the spurious frequency and at 150 MHz. It is also quite possible for the oscillator to jump from 150 MHz to the spur frequency as a result of temperature fluctuations. Such circuit performance would obviously be unacceptable in a superheterodyne receiver, possibly rendering the receiver inoperative. This problem is elegantly solved by utilizing the present invention.

Although somewhat structurally similar to the present invention, monolithic crystal filter devices, such as those shown in U.S. Pat. No. 4,342,014 to Arvanitis which is commonly assigned to the assignee of the present invention, are distinctly different from the present invention. The individual resonators of Arvanitis must cooperate by being acoustically coupled at approximately the same frequency in order for the filter to function as a bandpass filter with a smooth passband response.

The present invention, on the other hand, is directed toward placing a number of resonators, possibly of various substantially different frequencies, on a single substrate and having them operate in a substantially independent manner with distinct and sharp resonant peaks. Preferably the resonator would find utility as an oscillator resonator. In operation as a filter, the Arvanitis device will exhibit a broad passband and sharp filter skirts as shown in his FIG. 8 as a result of the high degree of interaction of his resonators. This response is obviously excellent for a filter but renders it impractical to use as an oscillator or other device requiring a sharp, distinct peak. The present invention fills this void by providing a resonator with a sharp, distinct response peak which results from the cooperation of a unique single resonator structure. This structure is useful when a new degree of design freedom is desired in a multiple resonator design having a plurality of resonators which must exhibit independent operation.

The features of the invention believed to be novel are set forth with particularity in the appended claims. The invention itself, however, both as to structure, organization and method of operation, together with further objects and advantages thereof, may be best understood by reference to the following description taken in conjunction with the accompanying drawings.

SUMMARY OF THE INVENTION

It is an object of the present invention to provide an improved trapped energy resonator design for independent use with multiple resonators on a single substrate.

It is another object of the present invention to provide an improved trapped energy resonator design which affords a new degree of freedom in adjusting the electrical parameters of the resonator when independently used with multiple resonators on a single substrate.

It is another object of the present invention to provide an improved trapped energy resonator for use in high stability oscillators.

It is still another object of the present invention to provide an improved trapped energy resonator design which has optimum spurious performance without degrading the series resistance while simultaneously maintaining freedom to adjust the frequency when constrained by independent use with multiple resonator substrates.

In one embodiment of the invention a trapped energy resonator includes a piezoelectric substrate having two opposed major surfaces. A first electrode is disposed on a first major surface of the piezoelectric substrate. The first electrode further comprises a first plurality of acoustically coupled sub-electrodes. The first plurality of sub-electrodes is electrically interconnected. A second electrode is disposed on a second major surface of the piezoelectric substrate. The second electrode further comprises a second plurality of acoustically coupled sub-electrodes. The second plurality of sub-electrodes is electrically interconnected. The first plurality and the second plurality of sub-electrodes are sufficiently acoustically coupled to allow the first and second electrodes to operate as a single resonator at a single resonant frequency and overtones thereof. This resonator is sufficiently acoustically and electrically isolated from other resonators on the substrate to allow it to operate substantially independently and isolated therefrom.

DETAILED DESCRIPTION OF THE PREFERRED EMBODIMENT

Figure 4:
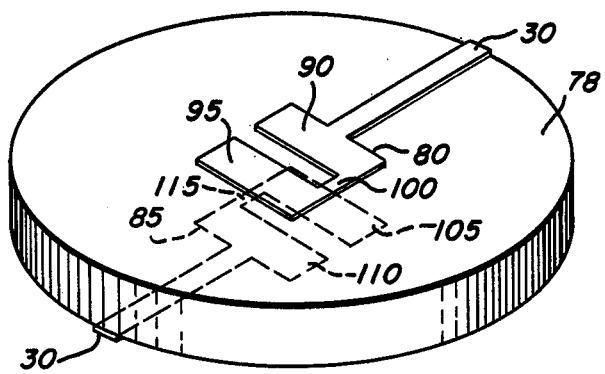
FIG. 4 is a perspective view of the resonator design of the present invention with only one resonator of a multiple resonator design shown.

Turning now to FIG. 4, resonator 75 of the preferred embodiment is shown. For clarity, only one set of electrodes is shown, but it is understood that resonator 75 would be part of a multi-resonator design wherein a number of resonators would have to operate in a substantially independent manner while sharing a single substrate. A substrate 78, which is composed of a piezoelectric material such as quartz, has a top electrode 80 disposed on one major surface of the substrate 78. A bottom electrode 85 is disposed on the other major surface of substrate 78. These electrodes are deposited on the substrate, either one surface at a time, or both surfaces simultaneously, using shadow masking techniques or other fabrication techniques known in the art. As in the prior art, the peripheral electrode geometry is rectangular and the edges of electrodes 80 and 85 are preferably parallel to the crystal's "X" and "Z" axes. Metallized runners 30 are utilized as input and output for the device to make connection to other circuitry such as an oscillator circuit. To realize the function of the present invention, these runners 30 should not be connected directly together either internal or external to the device package. Top electrode 80 is divided into two smaller electrodes and to avoid confusion, these smaller electrodes will be hereafter referred to as sub-electrodes 90 and 95. In the preferred embodiment, these sub-electrodes 90 and 95 are substantially symmetrical and located physically close enough together (typically on the order of a few thousands of an inch) to be highly acoustically coupled by the bulk evanescent mode and are electrically connected together by a narrow interconnecting conductor 100.

Similarly, bottom electrode 85 is comprised of bulk mode acoustically coupled sub-electrodes 105 and 110 interconnected by a narrow interconnecting conductor 115. Interconnecting conductor 115 is preferably located as far away from conductor 100 as possible as shown in FIG. 4 to prevent exciting stray spurious responses. In the preferred embodiment interconnecting conductors 100 and 115 are as narrow as practical. Although only one set of electrodes is shown on substrate 78, it is clear to those skilled in the art that others would be placed on the same substrate far enough away to cause negligable acoustic coupling with the present resonator thereby allowing substantially independant resonant activity of the resonator 75. The spaces between the sub-electrodes in FIG. 4 have been exaggerated in the drawing for clarity.

Figure 5:
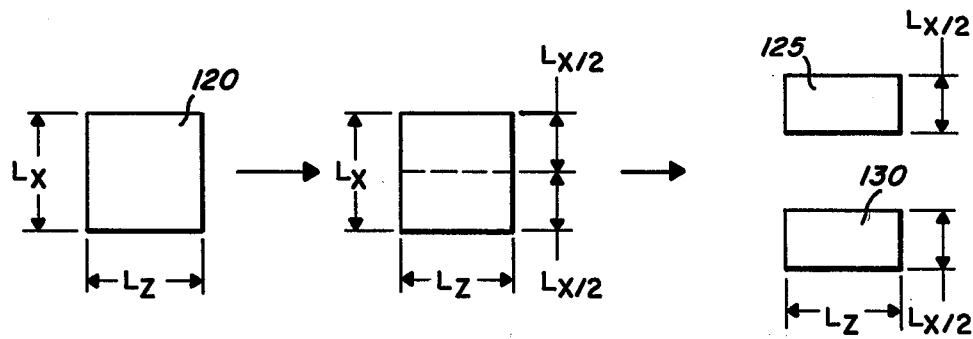
FIG. 5 is a top view of a square electrode configuration divided into two smaller electrodes for the present invention.

To more fully understand the operation of the invention, refer now to FIG. 5 and consider a square resonator electrode configuration 120 of dimensions $L_x$ and $L_z$ along the "X" and "Z" crystallographic axes, respectively. For a given value of H, this resonator will have a given resonant frequency (F) which may be approximated by equation (2). If this electrode were divided into two smaller electrodes 125 and 130 of dimensions $L_z$ by $L_x/2$ (or $L_z$ by $L_z/2$) each of the smaller resonators with electrodes 125 and 130 would have substantially the same resonant frequency which is defined by equation (2), where $L_x/2$ has been substituted for $L_x$. It is evident by inspection of equation (2) that each of these smaller resonators exhibits a resonant frequency which is much higher than that of the original square electrode resonator, if they are sufficiently separated so as not to be significantly acoustically coupled together.

As these two smaller electrodes become acoustically coupled by being brought close together, their individual resonances split into two distinct resonances just as a pair of inductively coupled L-C circuits would, as is well known in the art. In the limit, as they come physically very close together, the lower of the resonances approaches the resonant frequency of the single larger resonator 120. It has been found that if these two smaller resonators are electrically interconnected as by conductors 100 and 115 the higher resonant frequency is not piezoelectrically excited and is, therefore, not seen electrically. Additionally, since the overall peripheral geometry determines the series resistance, a low value of Rs can be maintained. These are underlying principles on which the present invention is based.

By dividing a single electrode into electrically interconnected and acoustically coupled sub-electrodes the resonator engineer is afforded a new degree of freedom which was heretofore unattainable. Referring again to FIG. 4 as an example of the preferred embodiment, this resonator design has a top electrode 80 and a bottom electrode 85 both of which exhibit approximately square peripheral geometry. The spur performance is therefore comparable to that of a square prior art resonator. In the preferred embodiment aspect ratios between about 0.5 and 2.0 have been found to yield acceptable spur performance which avoids the oscillator problems discussed previously. Deviation from the ideal aspect ratio (of one) for spurious response is sometimes necessary to facilitate design layout and other considerations. Since each sub-electrode pair 90 and 95, and 105 and 110 is electrically interconnected by interconnecting conductors 100 and 115 respectively, the series resistance is approximately that of the peripheral electrode area. That is, each sub-electrode's series resistance is approximately twice that of electrode 120. By connecting two sub-electodes in parallel the effective resistance is cut in half.

The single desired resonant frequency, fundamental or overtone, of resonator 75 may be adjusted anywhere between the higher resonant frequency of each of the sub-electrodes and the lower resonant frequency of a resonator having areas equal to the sum of the area of each of these sub-electrodes. This is accomplished without degradation of series resistance or spur performance and is accomplished independent of H which must be held constant for all resonators occupying the same substrate. Therefore as a result of utilizing the teachings of the present invention, an oscillator resonator could readily be placed on the same substrate with an IF crystal filter of significantly different frequency without the need to deposit the electrodes of different values of H and without degrading series resistance or spurious performance.

Figure 1:
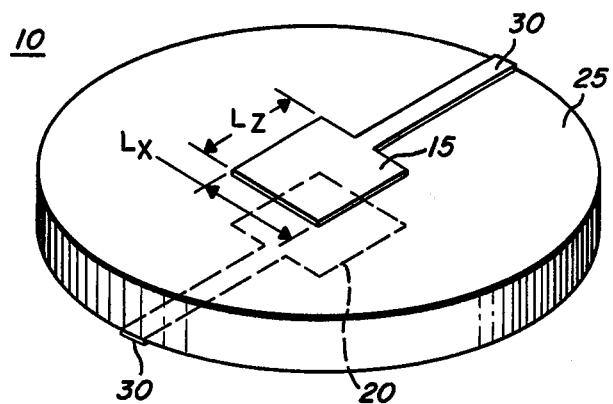
FIG. 1 is a perspective view of a typical prior art resonator with only one electrode pair shown.
Figure 2:
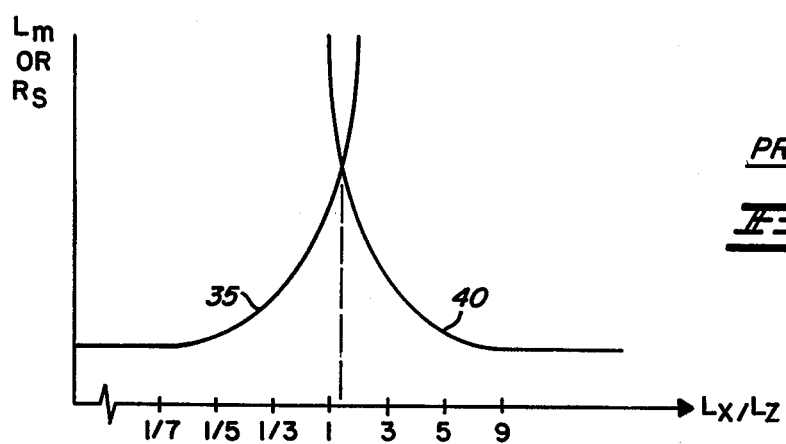
FIG. 2 is a plot showing a series resistance curve of spurious modes versus the aspect ratio of a rectangular resonator of the prior art.
Figure 3:
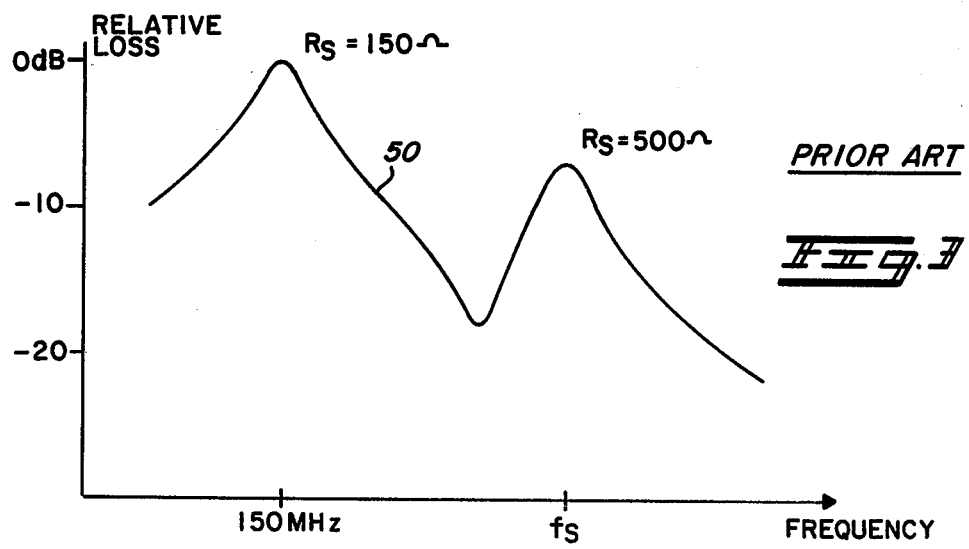
FIG. 3 is a plot of relative loss versus frequency for a typical 150 MHz fifth overtone crystal resonator of the prior art.
Figure 6:
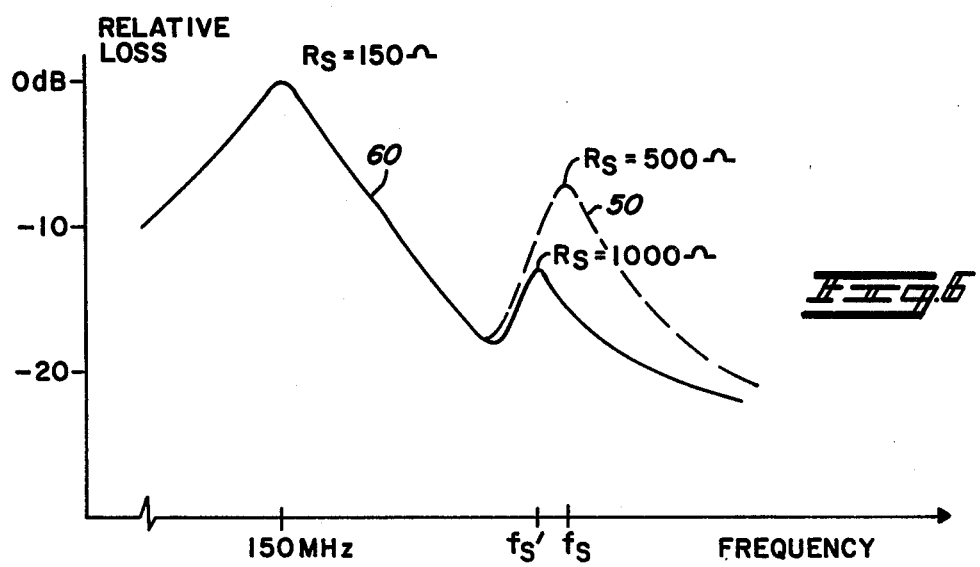
FIG. 6 is a plot of relative loss versus frequency for the resonator design of the present invention designed under the same constraints as the design of FIG. 3.

FIG. 6 shows the spur performance of a resonator utilizing the present invention and designed under the same constraints as those employed for the prior art resonator whose performance is shown in FIG. 3. This resulted in a resonator design in which each of the sub-electrodes was approximately 11.2×44 mils with a sub-electrode separation of approximately 8 mils. The interconnecting conductor was approximately 3 mils wide. Curve 60 is the resulting performance of that resonator. Curve 50 in dashed lines shows the relative performance of the prior art resonator for comparison with that of the present invention. It should be noted that the series resistance at spur frequency $f_s'$ is about double that of the series resistance of the prior art $f_s$. It should also be noted that although the spur frequency has been brought slightly closer to the desired response frequency of 150 Mhz, the spur level has been effectively cut to approximately −13 dB. At this low level the spurious response is not likely to cause any of the oscillator problems associated with the prior art design such as the possibility of oscillation at the spur frequency.

One skilled in the art will readily recognize that a major advantage of the present invention is the new degree of design freedom afforded by it. As such, it should be carefully noted that the preferred embodiment is only illustrative of one potential mode of improved performance afforded by implementing the sub-electrode design technique. That is, in the preferred embodiment, this technique was used to vary the frequency of a resonator without degrading the spurious performance or series resistance for a rectangular resonator. The scope of the invention however, should not be limited to square resonators, rectangular resonators or symmetrical sub-electrode pairs even though these features appear in the preferred embodiment. The present invention is equally valid for other resonator geometries when an additional degree of design freedom is necessary to optimize particular electrical or layout parameters. Similarly, a division of the electrode into more than two sub-electrodes should produce similar results.

Figure 7:
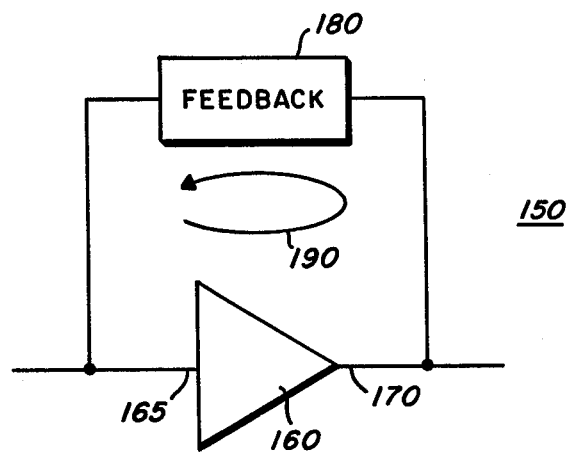
FIG. 7 is a schematic representation of an oscillator utilizing the present invention.

Resonator 75 will likely find its greatest utility as the frequency determining element in an electronic oscillator 150 as shown in FIG. 7. In this generalized oscillator circuit, an amplifier 160 has a gain of greater than one and an input 165 and an output 170. A feedback network 180 is operatively connected between the output 170 and input 165 to form a closed loop system 150 where the loop is defined as loop 190.

As is well known in the oscillator art, the phase shift around loop 190 must total n×360 degrees, where n=0, 1, 2, ..., in order to achieve oscillation. Once the oscillator begins oscillating and a state of equilibrium is reached, the loop gain will be unity.

According to the present invention, feedback network 180 includes a piezoelectric resonator such as resonator 75 of FIG. 4. This resonator includes substrate 78 having first and second opposed major surfaces. Disposed on each surface is a pair of electrically interconnected and acoustically coupled sub-electrodes.

Thus it is apparent that there has been provided in accordance with the invention a method, and apparatus that fully satisfies the objects, aims and advantages set forth above. While the invention has been described in conjunction with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

I claim:

1. A trapped energy piezoelectric resonator operating at a single resonant frequency and overtones thereof for independent use on a substrate having a plurality of resonators, comprising:
   a piezoelectric substrate having a first and a second opposed major surface;
   a first electrode disposed on said first major surface, said first electrode being comprised of a first plurality of acoustically coupled sub-electrodes;
   first means for electrically interconnecting said first plurality of sub-electrodes;
   a first conductor attached to said first electrode for electrical circuit connection thereto;
   a second electrode disposed on said second major surface, said second electrode being comprised of a second plurality of acoustically coupled sub-electrodes;
   second means for electrically interconnecting said second plurality of sub-electrodes;
   a second conductor attached to said second electrode for electrical circuit connection thereto;
   said first plurality of sub-electrodes being sufficiently acoustically coupled together and said second plurality of sub-electrodes being sufficiently acoustically coupled together for said first and second electrodes to operate as a resonator at a single resonant frequency and overtones thereof; and
   said resonator being sufficiently acoustically and electrically isolated from others of said plurality of resonators on said substrate to allow substantially independent and isolated operation.

2. The resonator of claim 1 wherein the peripheral geometry of said first and second electrodes is substantially rectangular.

3. The resonator of claim 2 wherein the geometric aspect ratio of said first and second electrodes is between approximately 0.5 and 2.0.

4. The resonator of claim 3 wherein the peripheral geometry of said first and second electrodes is approximately square.

5. The resonator of claim 1 wherein said first plurality of sub-electrodes is a first pair of sub-electrodes and said second plurality of sub-electrodes is a second pair of sub-electrodes.

6. The resonator of claim 5 wherein said first plurality of sub-electrodes is substantially symmetrical and said second plurality of sub-electrodes is substantially symmetrical.

7. The resonator of claim 6, wherein said first interconnecting means includes a first narrow conductor and said second interconnecting means includes a second narrow interconnecting conductor.

8. A trapped energy piezoelectric resonator comprising:
   a piezoelectric substrate having a first and a second opposed major surface;
   a first electrode exhibiting substantially square peripheral geometry disposed on said first major surface, said first electrode being comprised of a first pair of acoustically coupled sub-electrodes;
   a first narrow conductor electrically interconnecting said first pair of acoustically coupled sub-electrodes;
   a second electrode exhibiting substantially square peripheral geometry disposed on said second major surface and acoustically coupled to said first electrode, said second electrode being comprised of a second pair of acoustically coupled sub-electrodes; and a second narrow conductor electrically interconnecting said second pair of acoustically coupled sub-electrodes.

9. A crystal oscillator, comprising:

an amplifier having a gain greater than one, and having an output and an input;

a feedback network operatively connected from said amplifier's output to said amplifier's input to form a closed loop system, said feedback network including a piezoelectric resonator, comprising:

(a) a piezoelectric substrate having a first and a second opposed major surface;
(b) a first electrode disposed on said first major surface, said first electrode being comprised of a first pair of electrically and acoustically coupled sub-electrodes;
(c) a second electrode disposed on said second major surface said second electrode being comprised of a second pair of electrically and acoustically coupled sub-electrodes;

said closed loop system having a loop gain at equilibrium of one and a total phase shift around the loop of $n \times 360$ degrees, where $n = 0, 1, 2, \ldots$.

* * * * *